United States Patent [19]

Vidusek et al.

[11] Patent Number: 4,806,453
[45] Date of Patent: Feb. 21, 1989

[54] POSITIVE ACTING BILAYER PHOTORESIST DEVELOPMENT

[75] Inventors: David A. Vidusek, Natick; Michael Legenza, Bellingham; Jeffery L. Vincent, Hudson, all of Mass.

[73] Assignee: Shipley Company Inc., Newton, Mass.

[21] Appl. No.: 860,421

[22] Filed: May 7, 1986

[51] Int. Cl.$^4$ ............................................. G03F 7/26
[52] U.S. Cl. ................................... 430/312; 430/156; 430/326; 430/331
[58] Field of Search ............... 430/299, 326, 331, 312

[56] References Cited

U.S. PATENT DOCUMENTS

| 4,211,834 | 7/1980 | Lapadula | 430/326 |
| 4,411,981 | 10/1983 | Minezaki | 430/299 |
| 4,423,138 | 12/1983 | Guild | 430/326 |
| 4,524,121 | 6/1985 | Gleim et al. | 430/326 |

FOREIGN PATENT DOCUMENTS 0062733 10/1982 European Pat. Off. ............ 430/331

Primary Examiner—Charles L. Bowers, Jr.
Attorney, Agent, or Firm—Robert L. Goldberg

[57] ABSTRACT

The invention is for a developer for a bilayer photoresist film comprising a first relatively thick layer of a polyglutarimide and a second relatively thin layer of a diazo sensitized novolak resin. The developer is an aqueous solution of a tetra alkyl ammonium hydroxide where at least two of the alkyl groups have two or more carbon atoms. The developer of the invention permits development of the bottom resist layer without erosion of the top resist layer.

8 Claims, No Drawings

POSITIVE ACTING BILAYER PHOTORESIST DEVELOPMENT

BACKGROUND OF THE INVENTION

1. Introduction

This invention relates to a developer for a bilayer photoresist film. More particularly, the invention relates to a developer capable of selectively developing the bottom layer of a bilayer resist film without significant attack on the top layer of the film.

2. Description of the Prior Art

Etch resistant masks are commonly fabricated in the manufacture of integrated circuits and other microminiature electronic devices. In a typical fabrication process, a radiation sensitive layer of a photoresist is coated onto a substrate and exposed in an image pattern to activating radiation such as visible, ultraviolet, x-ray, nuclear or electron beam radiation. The radiated portions of the resist layer undergo a chemical change which converts the resist material either to a more soluble (positive resist) or less soluble(negative resist) form than the non-radiated areas. A developer is used to preferentially remove the more soluble areas, which in a positive resist, are the radiated areas, and in a negative resist, are the non-radiated areas. Following development, the substrate may be subjected to selective processing steps through the openings in the resist layer or mask, for example by etching or deposition.

The size of a semiconductor device is a factor in the ultimate speed of an integrated circuit as well as in the initial and operational cost of the device. Therefore, efforts have been made to reduce the size of individua components and to increase the packing density of integrated components. Size reduction is limited by the accuracy with which an etch resistant mask can be fabricated and positioned. Because certain processing steps such as electroplating, reactive ion etching and lift off require a relatively thick mask, the limiting factors in a multilevel fabrication process often are mask resolution and aspect ratio (thickness of mask/minimum practical line width at that thickness) which can be achieved during fabrication of thick etch resistant masks. Resolution and aspect ratio are limited in part by the choice of resist material and activating radiation and in part by the type and resolution of the exposure system.

Positive working photoresists comprising an o-quinone diazide sensitizer in a phenol-formaldehyde resin are in common use. A typical resist is composed of a base soluble polymer such as a phenol-formaldehyde novolak resin and a photosensitive compound such as a naphthoquinone-(1,2)-diazide sulfonic acid ester sensitizer. Such resists and sensitizers from which they are formulated are described, for example, in U.S. Pat. Nos. 3,046,118; 3,046,121; 3,106,465; 3,201,239; 3,666,473; and 4,007,047; all incorporated herein by reference. O-quinone diazide sensitized phenol-formaldehyde resists have high sensitivity and submicron resolution when the resist layer thickness is sufficiently small that the diffraction and absorption effects do not limit image resolution. Thick resist layers of this type (greater than one micron in thickness) have a low aspect ratio and a much reduced resolution due to optical diffraction and absorption effects.

Another positive resist known to the art contains a partially aqueous soluble imidized acrylic polymer in a non-aqueous solvent. Such a resist is disclosed in U.S. Pat. No. 4,524,121 incorporated herein by reference. The aqueous soluble, imidized acrylic polymers, known in the art as "polyglutarimides", can be dissolved in a non-reactive non-aqueous solvent to form a positive resist system that can be deposited as an adherent film on a substrate. Such films are capable of high image resolution.

When a photoresist such as a polyglutarimide or an o-quinone diazide sensitized phenol-formaldehyde is exposed by optical projection, depth of field will limit image resolution and aspect ratio unless the photoresist layer is thin. While it is possible to avoid a depth of field problem by forming an image with a narrow photon beam and computer controlling it to directly write a pattern onto a resist layer, this approach is not practical for high volume production because it involves precision manipulation of an optical lens system which is slow and impractical. Exposure by contact printing also avoids depth of field problems, but it involves other disadvantages. Contact printing tends to scratch masks so that contact masks have a short life. Proximity printing rather than contact printing extends the life of the mask but diffraction effects are worse. Diffraction effects may be reduced by reducing the wavelength of the exposure light, but this type of improvement is ultimately limited by the light sensitivity and absorption characteristics of the resist. Because of these problems, it has not been practical to fabricate high resolution thick masks from either diazo sensitized phenol-formaldehyde or polyglutarimide positive photoresists.

U.S. Pat. No. 4,211,834, incorporated herein by reference, proposes a method for fabricating a thick, etch-resistant image with high aspect ratio and resolution while avoiding or reducing diffraction effects. This patent utilizes a bilayer resist approach and is based in part upon the recognition that o-quinone diazide sensitized phenol-formaldehyde resists are opaque below 3,000 A while other positive working resists are sensitive to radiation below 3,000 A. Utilizing the difference in spectral response, a first thick resist layer may be applied over a substrate and coated with a thin layer of a second resist. The first or bottom resist layer would be one responsive to activating radiation below 3,000 A, such as within the deep ultra violet range, while the second or top resist layer would be one responsive above 3,000 A. In accordance with the patent, polymethyl methacrylate is used as the bottom resist layer. In accordance with the teachings of others, it has also been found that the polyglutarimides, referenced above, may be used as a bottom resist layer because they are also responsive to activating radiation below 3,000 A.

As aforesaid, a bilayer resist is formulated with a relatively thick bottom resist layer and a relatively thin top resist layer. The top resist layer is imaged and developed, using activating radiation having a wavelength in excess of 3,000 A. Development of the top resist layer results in a relief image which acts as a conformable mask over the bottom resist layer. The bottom resist layer may then be flooded with radiation of a wavelength lower than 3,000 A. Because the top resist layer of the diazide phenol-formaldehyde resist is opaque to radiation below 3,000 A, it is not exposed to this radiation and prevents exposure of the bottom resist layer beneath it. However, where the top resist layer has been removed by development, the bottom resist layer is exposed to this activating radiation and following exposure, can be developed to yield a relief image conforming to the relief image in the top resist layer.

The advantage to the bilayer resist film is that the diazide phenol-formaldehyde top resist layer may be made suitably thin to avoid resolution limiting effects arising from light diffraction or depth of field while the bottom resist layer may be made sufficiently thick to perform desired processing steps which require thick resist layers and high aspect ratio without losing the high resolution achieved by the thin top resist layer.

In theory, the bilayer resist should solve many of the problems described above. This is not the case because in practice, the material used to formulate the bottom layer of the bilayer film is a polymethyl methacrylate. The use of polymethyl methacrylate results in interlayer mixing which creates processing problems. In addition, the polymethyl methacrylate layer has a thermal flow point of about 120° C. and therefore has a tendency to flow during processing. Further, the polymethyl methacrylates do not possess adequate plasma resistance. Finally, the polymethyl methacrylates are developed in organic solvents which require special venting and waste treatment procedures.

Polyglutarimide resists have processing properties superior to those of polymethyl methacrylate. However, both the polyglutarimide resists and the diazo phenol formaldehyde resists are developed in aqueous alkaline solutions of tetramethyl ammonium hydroxide or sodium hydroxide. In practice, it has been found that exposure and development of the top diazo phenol-formaldehyde resist layer followed by exposure and development of the bottom polyglutarimide resist layer results in excessive attack by the developer on the top resist layer resulting in substantial erosion of this layer, often to a point where the top resist layer is completely removed during development of the bottom resist layer. Since the top resist layer is a conformable mask for the bottom resist layer, the loss of the top resist layer during development results in loss of plasma resistance. In addition, the diazo phenol-formaldehyde type resists are known to have excellent plasma etch resistance. This etch resistance is superior to the etch resistance of the polyglutarimides. Consequently, loss of the diazo phenol formaldehyde top resist layer results in an overall decrease in the protection provided the substrate from plasma etching.

SUMMARY OF THE INVENTION

The subject invention is an aqueous alkaline developer for development of an exposed bottom resist layer of a bilayer photoresist film comprising a relatively thin top layer of a diazo sensitized phenol formaldehyde photoresist and a relatively thick, planarizing bottom resist layer of a polyglutarimide.

For purposes of definition, in the description which follows, the term "bottom resist layer" as used herein shall mean a resist layer formulated from a polyglutarimide resist and the term "top resist layer" shall mean a resist formulated from a diazo sensitized phenol formaldehyde resin.

The developer of the invention is an aqueous alkaline solution of a tetraalkyl ammonium hydroxide having at least two alkyl groups with two or more carbon atoms and preferably tetra ethyl ammonium hydroxide. The developer is used after exposure and development of the top resist layer and exposure of the bottom resist layer. It is an unexpected result of this invention that development of the bottom resist layer can be achieved using the developer of the invention with little or no erosion of the top resist layer since tetraalkyl ammonium hydroxide compounds are known developers for the diazo sensitized phenol formaldehyde resists. Moreover, tetramethyl ammonium hydroxide is a homolog of the developers of this invention, yet tetramethyl ammonium hydroxide is unsatisfactory as a developer for the bottom resist layer because of aggressive attack of this developer on the top resist layer. It has been found that complete removal of the top resist layer may result using tetramethyl ammonium hydroxide in the strength required to develop the bottom resist layer.

The subject invention also provides a method for forming a relief image in a bilayer resist film. This method comprises:

(1) formation of a bilayer resist film comprising a relatively thick polyglutarimide bottom resist layer and a relatively thin diazo sensitized phenol formaldehyde top resist layer;

(2) exposing the top resist layer to activating radiation without exposing the bottom resist layer;

(3) developing the top resist layer with a developer that does not dissolve the unexposed bottom resist layer;

(4) exposing the bottom resist layer through the developed top resist layer to a source of activating radiation which does not activate the top resist layer; and (5) developing the bottom resist layer with the developer of this invention.

DESCRIPTION OF THE PREFERRED EMBODIMENTS

The polyglutarimide resist used to prepare a bottom resist layer in accordance with the invention is the partially aqueous soluble imidizide acrylic polymers as described in U.S. Pat. Nos. 4,246,374 and 4,524,121, both incorporated herein by reference. The polyglutarimide polymers have at least about 5 percent by weight glutarimide units of the following structural formula:

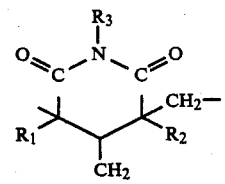

where $R_1$, $R_2$ and $R_3$ independently represent hydrogen or unsubstituted or substituted alkyl, aryl, aralkyl, or alkaryl hydrocarbons having from one to twenty carbon atoms or mixtures thereof.

The physical properties of the polyglutarimide photoresist film can also be adjusted by varying the molecular weight of the polyglutarimide coupler resin. The molecular weight of the resulting polyglutarimide is typically close to the molecular weight of the precursor acrylic polymer from which the polyglutarimide is formed. Therefore, by selecting an acrylic polymer of known molecular weight and forming a polyglutarimide, the film properties of a positive photoresist system can be optimized for each admixture of polyglutarimide and solvent with or without the addition of a photoactive sensitizer. Typically the molecular weight of the polyglutarimide coupler resin ranges from about 4,500 weight average molecular weight to about 200,000 weight average molecular weight. In order to achieve optimum development of positive resist films in an aqueous base developing solution, the molecular weight of the polyglutarimide resin should preferably be at least about 50,000 weight average molecular weight.

The polyglutarimides are capable of dissolution in non-aqueous, non-reactive solvents and the system can be used to deposit an adherent, high quality, aqueous base developable, positive resist film on a substrate. When used as the planarizing layer in a multilayer resist, conventional positive acting photosensitizers have been found to be compatible with the polyglutarimide resin and soluble in the same solvents in which the polyglutarimides are soluble. These photosensitizers include diazo oxides such as the 4',2',3'-trihydroxy benzophenone ester of 1 - oxo - diazo naphthalene -5- sulfonic acid. Other useful sensitizers can be formed from quinone diazides such as benzoquinone diazides such as benzoquinone 1,2-diazide-4-sulfonylchloride; and naphthoquinone diazides such as naphthoquinone -1,2- diazide -5- sulfochloride, naphthoquinone -1,2- diazide -4- sulfochloride, naphthoquinone -2,1- diazide -4- sulfochloride, and naphthoquinone -2,1-diazide -5- sulfochloride. Other diazo compounds other than the diazo oxides or quinone diazide compounds may also be suitable reagents for forming positive sensitizers. Mixtures of the polyglutarimides and the sensitizers in weight ratios of from about 99:1 to about 1:1 can be spun cast from a suitable solvent to give high quality clear films with no hazing or other indicia of component separation due to incompatibility. Typically the level of the sensitizer compound ranges from about 5 to about 30 weight percent based on the weight of the polyglutarimide coupler resin.

Preferred non-aqueous, non-reactive solvents useful for dissolving polyglutarimides and sensitizers include Acetol, tetrahydrofurfuryl alcohol, N-methyl-pyrollidinone, Methyl Carbitol, Methyl Cellosolve, and cyclopentanone.

The positive polyglutarimide photoresist is capable of being spun cast from solution to deposit an adherent film on an oxide coated, nitride coated or uncoated silicon wafer or aluminum coated substrate. The thickness of the photoresist film can be controlled by adjusting the level of coupler resin and/or sensitizer solids in the mixture, the level and type of solvent, and by varying the spin speed. Any conventional spin casting method such as those described in *Integrated Circuit Fabrication Technology*, D. J. Elliott, McGraw-Hill Book Company, 1982, chapter 6, pages 124–144, can be utilized with the photoresist system. For use in a bilayer film, the polyglutarimide bottom resist layer should have a thickness of at least 0.5 micrometers and preferably a thickness varying between 1 and 3 micrometers.

The top resist layer is formed from a positive diazo phenol formaldehyde (novolak) photoresist. Novolak is a generic term used to identify low molecular weight condensation polymers of phenols, such as cresol and formaldehyde. On a solids basis, a conventional diazo phenol formaldehyde photoresist system contains about 75 percent by weight of the solids, a novolak resin and about 25 percent of the solids of a sensitizer dissolved in a solvent system.

A typical positive acting sensitizer, useful with resins such as novolak, is a naphthoquinone diazide formed by reacting naphthoquinone -1,2- diazide -5- sulfochloride. Diazo sensitized novolak resin resists are commercially available in the marketplace and sold under the tradename Microposit ®1350 photoresist from Shipley Company Inc. of Newton, Mass.

A suitable solvent for this novolak resin/sensitizer mixture is a mixture of Cellosolve Acetate (ethylene glycol monoethyl ether acetate), xylene and butyl acetate in a weight ratio of about 80/10/10.

The diazo phenol formaldehyde top resist layer is coated onto the polyglutarimide bottom resist layer in conventional manner such as by spinning. Following coating of the photoresist top layer over the bottom layer, the top layer is dried in accordance with art recognized procedures. The top photoresist layer is preferably significantly thinner than the polyglutarimide bottom layer, the top resist layer preferably having a dry thickness of less than one micrometer and preferably within the range of from about 0.1 to 0.8 micrometers.

Following formation of the bilayer resist film, the film is ready for processing. The first step in the processing sequence comprises exposure of the top photoresist layer to a source of activating radiation which activates the top layer, but not the underlying polyglutarimide resist layer. Activating radiation in the near UV range in excess of 3,000 A is suitable for this purpose.

Following exposur of the top resist layer to activating radiation, the layer is developed by contact with an aqueous alkaline developer as is known in the art. A preferred developer is a metal ion-free developer formulation comprising tetra methyl ammonium hydroxide as a source of alkalinity and a quaternary ammonium hydroxide surfactant as described in European Pat. No. 0,062,733, incorporated herein by reference. A preferred developer is disclosed in Example 1 of said patent. Preferably, the tetramethyl ammonium hydroxide is tetra methyl ammonium hydroxide present in a concentration of between about 1.0 and 20 weight percent of the formulation and the surfactant is present in an amount of about 0.001 to 1.0 percent by weight of the formulation. Other aqueous alkaline solutions known in the art as developers for such photoresists are also useful such as aqueous solutions of sodium hydroxide.

The development of the top resist layer provides a conformable mask over the bottom resist layer. The next step in the process comprises exposing the bottom resist layer through the conformable mask top layer to a source of activating radiation. As described above, the activating radiation is at a wavelength of 3000 A or less. Exposure is pursuant to conditions known to those skilled in the art. For example, the resist layer may be exposed using a mercury or mercury - xenon short arc lamp as the exposure source coupled with deep ultraviolet mirrors that reflect optimally between the wavelengths of 220 too 300 nm. Equipment of this nature is commercially available with a variety of power options. Deep ultraviolet energy of approximately 2 to 6 joules per cm*cm is required to properly expose a 1 $\mu$m film of polyglutarimide resist using the developers of this invention. Dependent upon the power output of the exposure unit, the exposure time required may range from about 1 to 5 minutes. A Deep ultraviolet exposure is the preferred embodiment of the invention. However, exposure can be accomplished by alternative exposure sources such as laser irradiation, e-beam exposure, etc. Such alternative modes would be within the knowledge of the art.

The developer for the bottom resist layer is an aqueous solution of a tetra alkyl ammonium hydroxide where the hydroxide has at least two alkyl groups of two or more carbon atoms and preferably, where all alkyl groups have two or more carbon atoms, though all alkyl groups need not be the same. More preferably, the alkyl groups have from 2 to 4 carbon atoms. The most preferred tetra alkyl ammonium hydroxides are tetra ethyl ammonium hydroxide, tetra propyl ammonium hydroxide and tetra butyl ammonium hydroxide, tetra ethyl ammonium hydroxide being preferred.

Solutions of tetra methyl ammonium hydroxide have been successfully used in the prior art to develop diazo sensitized novolak resist layers without significant attack on the unexposed portions of the resist film. However, in a bilayer configuration, it has been found that the tetra methyl ammonium hydroxide, in a concentration required to develop the underlying bottom polyglutarimide resist layer, aggressively attacks the novolak resist layer reducing its thickness and thereby impairing its ability to act as a high resolution conformable mask. Surprisingly, it has been found that if a tetra alkyl ammonium hydroxide of the type contemplated herein is used in place of the tetra alkyl ammonium hydroxide in a concentration sufficient to develop the underlying polyglutarimide, attack on the top novolak resist layer is minimal.

The tetra alkyl ammonium hydroxide preferably is an aqueous solution containing from 0.5 to 20 weight percent of the hydroxide and more preferably from 1 to 10 weight percent of the hydroxide. The preferred hydroxide is tetra ethyl ammonium hydroxide. The solution may also contain other ingredients, especially surfactants. A preferred class of surfactants are those disclosed in the above referenced European Pat. No. 0,062,733 comprising quaternary ammonium hydroxides. The surfactants are optional, but preferably used in a concentration of 0.0001 to 5.0 weight percent and more preferably, in a concentration of from 0.001 to 0.005 weight percent.

Following development of the bottom resist layer with the developers of the invention, the underlying exposed substrate material is treated in accordance with prior art methods. These methods include post-development bake and/or thermal cross linking to harden the top layer for subsequent processing. Thereafter, the substrates are treated in accordance with prior art methods such as by ion implantation, plasma etching, chemical vapor deposition, etc.

The invention will be better understood by reference to the examples which follow.

| Developer 1 | |
|---|---|
| Tetraethyl ammonium hydroxide | 2.0 gms |
| Surfactant[1] | 0.1 gms |
| Water | to 1 liter |
| Proprietary quaternized tetra alkyl ammonium hydroxide | |
| Developer 2 | |
| Tetramethyl ammonium hydroxide | 2.0 gms |
| Surfactant[1] | 0.1 gms |
| Water | to 1 liter |

Same as in Developer 1

EXAMPLE 1

Step 1: A 4 inch silicon wafer may be prepared in conventional manner by vapor priming with hydroxy methyl dimethyl sulfoxide to promote adhesion with excess material removed by rapid spinning.

Step 2: Approximately 5 mls of a polyglutarimide resist may be dispensed onto the prepared wafer and spun at about 4,000 rpm. The coated wafer may then be softbaked at a temperature of 290° C. to yield a coating that would have a thickness of about 0.90 μm.

Step 3: A novolak based resist such as S1400-17[R] resist available from Shipley Company Inc. of Newton, Mass. may then be dispensed onto the coated wafer and spun at a speed of about 4,000 rpm to form a uniform film. The coated wafer may then be softabaked at a temperature of about 95° C. using a forced air convection oven. The resulting film should have a thickness of about 0.75 μm.

Step 4: Using a GCA DSW stepper, the top layer may be irradiated at 436 nm for the steppers for 5 minutes to expose the top novolak resist layer. The top layer may then be developed using a conventional developer for such resists such as Microposit 352 of Shipley Company Inc., a proprietary aqueous solution of sodium hydroxide. Development is by immersion or spray for a time sufficient to develop the desired image without attack on the underlying polyglutarimide resist - typically for a period of about 3 minutes.

Step 5: The polyglutarimide resist layer may be exposed using a Hybrid Technology Group 1,000 watt deep ultraviolet mercury - xenon short arc lamp with irradiation of about 275 nm for 3 minutes. The residue top layer serves as a mask to this incident deep ultraviolet irradiation and provides the same pattern as that initially used to generate the top layer.

Step 6: The polyglutarimide layer may be developed with Developer 1 by spraying the developer onto the wafer for 60 seconds followed by a deionized water rinse and a high speed spin to dry the wafer. Image quality of the resulting profiles would be excellent with nearly vertical walls from the top of the novolak resist through the planarizing layer to the substrate/planarizing layer interface.

An inspection of the remaining novolak resist layer would show that there is virtually no erosion of this layer as a consequence of the development of the polyglutarimide layer with Developer 1. No degradation of the image profile not isotropic attack on the sidewalls of the novolak resist would be noted. Subsequent thickness measurements would show about a 200 angstrom loss of the top layer but this would be within the experimental error of the measuring instrumentation.

EXAMPLE 2

The procedure of Example 1 could be repeated substituting Developer 2 for Developer 1 in step 6. Following the development step, much of the novolak resist would have been removed with substantial areas of the polyglutarimide film having uncapped regions.

EXAMPLE 3

The procedure of Example 1 may be repeated substituting tetra propyl ammonium hydroxide for tetra methyl ammonium hydroxide in Developer with similar results obtained.

We claim:
1. A process for the exposure and development of a positive acting bilayer photoresist film comprising a bottom planarizing layer of a polyglutarimide photoresist and a top layer of a diazo sensitized novolak photoresist film, said process comprising the steps of
   i. exposing the top novolak resist layer to activating radiation at a wavelength that does not activate the bottom resist layer to form a latent image in said top layer;

ii. developing the top resist layer with a developer that does not dissolve the bottom resist layer to form a conformable mask over the bottom resist layer;

iii. exposing the bottom resist layer through the developed top resist layer to a source of activating radiation at a wavelength that does not activate the top resist layer to form a latent image in said bottom layer; and iv. developing the bottom resist layer with an aqueous alkaline solution comprising tetra ethyl ammonium hydroxide solution in a concentration of from 0.5 to 20 weight percent and a quaternary ammonium hydroxide surfactant whereby the botto resist layer is developed within aggressive attack on the top resist layer.

2. The process of claim 1 where the top resist layer has a thickness varying between 0.1 and 1.0 micrometers and the bottom resist layer has a thickness varying between about 1.0 and 3.0 micrometers.

3. The process of claim 1 where the developer for the top resist layer is an aqueous solution of a tetra ethyl ammonium hydroxide.

4. The process of claim 1 where the tetra ethyl ammonium hydroxide is present in a concentration of from about 3.0 to 10.0 percent by weight.

5. A process for the exposure and development of a positive acting bilayer photoresist film comprising a bottom planarizing layer of a polyglutarimide photoresist over a substrate and a top layer of a diazo sensitized novolak photoresist film over the layer of the polyglutarimide resist, said process comprising the steps of i. exposing the top novolak resist layer to activating radiation at a wavelength above 3000 angstroms to form a latent image in said top layer;

ii. developing the top resist layer with an aqueous solution of a tetra alkyl ammonium hydroxide developer that does not dissolve the bottom resist layer to form a conformable mask over the bottom resist layer;

iii. exposing the bottom resist layer through the developed top resist layer to a source of activating radiation at a wavelength below 3000 angstroms to form a latent image in said bottom layer; and iv. developing the bottom resist layer with an aqueous alkaline solution comprising tetra ethyl ammonium hydroxide solution in a concentration of from 0.5 to 20 weight percent and a quaternary ammonium hydroxide surfactant whereby the bottom resist layer is developed without aggressive attack on the top resist layer.

6. The process of claim 5 where the top resist layer has a thickness varying between 0.1 and 1.0 micrometers and the bottom resist layer has a thickness varying between about 1.0 and 3.0 micrometers.

7. The process of claim 5 where the tetra alkyl ammonium hydroxide used to develo the top resist layer is a tetra methyl ammonium hydroxide.

8. The process of claim 5 where the tetra ethyl ammonium hydroxide is present in a concentration of from about 3.0 to 10.0 percent by weight.

* * * * *